(12) United States Patent
Lee et al.

(10) Patent No.: US 7,631,850 B2
(45) Date of Patent: Dec. 15, 2009

(54) APPARATUS FOR SUPPORTING COOLING DEVICE

(75) Inventors: Hsieh-Kun Lee, Tu-Cheng (TW);
Chun-Chi Chen, Tu-Cheng (TW);
Shi-Wen Zhou, Shenzhen (CN);
Ping-An Yang, Shenzhen (CN); Meng Fu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 570 days.

(21) Appl. No.: 11/135,745

(22) Filed: May 24, 2005

(65) Prior Publication Data

US 2006/0126302 A1      Jun. 15, 2006

(30) Foreign Application Priority Data

Dec. 11, 2004   (CN) .................... 2004 2 0102727 U

(51) Int. Cl.
*H05K 7/20* (2006.01)
(52) U.S. Cl. .................. 248/658; 248/424; 248/647
(58) Field of Classification Search ............. 248/651, 248/655, 658, 637, 646, 424, 429, 657; 361/697
See application file for complete search history.

(56) References Cited

U.S. PATENT DOCUMENTS

| | | | | |
|---|---|---|---|---|
| 4,896,869 A | * | 1/1990 | Takekoshi | 269/60 |
| 5,740,013 A | * | 4/1998 | Roesner et al. | 361/697 |
| 5,959,838 A | * | 9/1999 | Liang | 361/697 |
| 5,960,862 A | * | 10/1999 | Hu | 165/80.3 |
| 5,988,566 A | * | 11/1999 | Meyer | 244/129.3 |
| 6,002,586 A | | 12/1999 | Chen et al. | |
| 6,392,885 B1 | | 5/2002 | Lee et al. | |
| 6,419,008 B1 | * | 7/2002 | Wu | 165/80.3 |
| 6,478,284 B2 | | 11/2002 | Qiu | |
| 6,588,543 B1 | * | 7/2003 | Tchilinguirian | 181/150 |
| 7,168,671 B2 | * | 1/2007 | Bostrom et al. | 248/419 |

* cited by examiner

*Primary Examiner*—J. Allen Shriver, II
*Assistant Examiner*—Steven M Marsh
(74) *Attorney, Agent, or Firm*—Frank R. Niranjan

(57) ABSTRACT

An apparatus (1) for supporting a cooling device (30) thereon includes a bracket (10) and a saddle (20) carrying the cooling device (30) thereon. The bracket (10) defines two opposing rails (12), (13) and a washboard-like member (14) extending along a direction in which the rails (12), (13) extend. The saddle (20) includes a positioning member (26) engaged in the washboard-like member (14) to position the saddle (20) to the bracket (10) and two blocks (24) slidable on the rails (12), (13) of the bracket (10) under condition that the positioning member (26) is disengaged from the washboard-like member (14).

10 Claims, 5 Drawing Sheets

APPARATUS FOR SUPPORTING COOLING DEVICE

BACKGROUND

1. Field

The present invention relates to an apparatus for adjustably supporting a cooling device, and particularly to an apparatus which can slidably mount a cooling device at a specified position.

2. Prior Art

As computer technology continues to advance, electronic components such as central processing units (CPUs) of computers are being made to provide faster operational speeds and greater functional capabilities. When a CPU operates at high speed in a computer enclosure, its temperature can increase greatly. It is desirable to dissipate the heat quickly, for example by using a heat dissipation device attached to the CPU in the enclosure. This allows the CPU and other electronic components in the enclosure to function within their normal operating temperature ranges, thereby assuring the quality of data management, storage and transfer.

A conventional heat dissipation device comprises a heat sink and a fan. The fan is mounted on a heat sink by screws engaging with threads defined in fins of the heat sink. Although the device can steadily mount the fan to the heat sink, it is still complex to operate by screws. Once installing the fan on the heat sink, it is difficult to make the fan disengage from the heat sink.

Oftentimes, a computer comprises a plurality of electronic components installed therein. The electronic components are generally arranged in line array and only narrow space is available between adjacent two electronic components. A plurality of heat sinks is attached on the electronic components for dissipating heat from the electronic components. Accordingly, a plurality of fans is installed in the computer enclosure for improving air convection within the enclosure. The fans are generally mounted to the computer one by one. However, the computer provides a small available space for installing each fan. Thus, it is difficult and inconvenient to mount the fans in right place.

Moreover, a computer enclosure usually contains several different types of mother boards, and more than one fan is need. Usually, the fan is mounted to correspond to a predetermined mother board and can not be moved again. Thus, if the mother board is changed, another fan must be designed and manufactured again to adapt the new mother board. It is inevitable to lead to cost waste. It is necessary to provide an apparatus which can adjustably carrying a fan to a computer to satisfy heat dissipation in different places.

SUMMARY OF THE INVENTION

What is needed is an apparatus for adjustably locating a cooling device in right place whereby the cooling device can be directed toward a cooled component, such as CPU or a mother board.

An apparatus for adjustably supporting a cooling device in accordance with a preferred embodiment of the present invention comprises a bracket and a saddle carrying the cooling device thereon. The bracket defines two opposing rails and a washboard-like member extending along a direction in which the rails extend. The saddle comprises a positioning member engaged in the washboard-like member to position the saddle to the bracket and two blocks slidable on the rails of the bracket under condition that the positioning member is disengaged from the washboard-like member.

Other objects, advantages and novel features of the invention will become more apparent from the following detailed description when taken in conjunction with the accompanying drawings, in which:

DETAILED DESCRIPTION OF THE INVENTION

Figure 1:
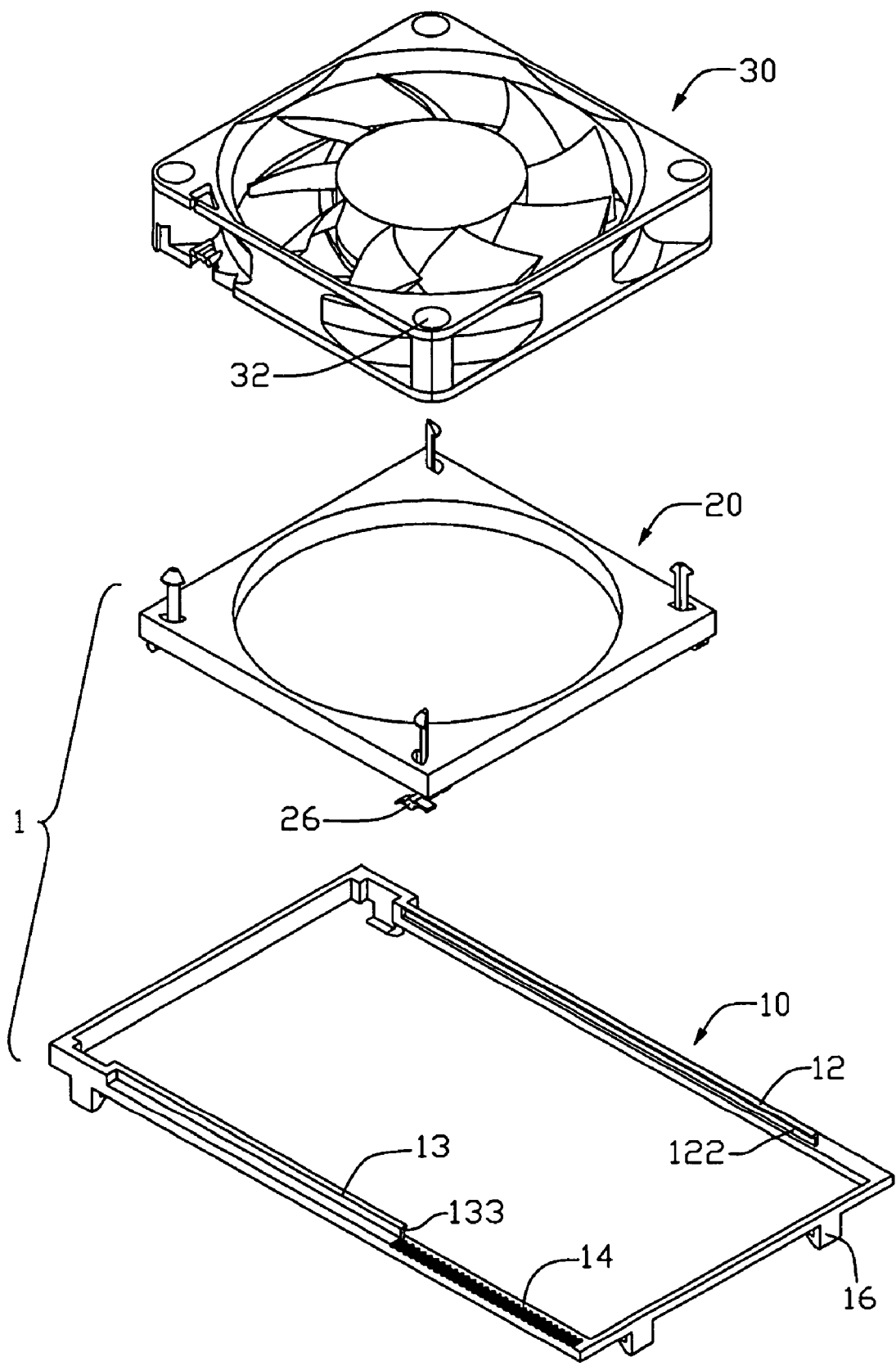
FIG. 1 is an exploded, isometric view of an apparatus in accordance with of a preferred embodiment of the present invention, and a cooling device capable of being adjustably mounted onto the apparatus.

FIG. 1 shows an apparatus 1 in accordance with a preferred embodiment of the present invention. The apparatus 1 comprises a bracket 10, and a rectangular saddle 20. A cooling device, such as a fan 30 may be adjustably mounted on the apparatus 1.

The bracket 10 comprises a first rail 12, a second rail 13, a plurality of jags 14 and four hooks 16 opposing to the first rail 12, the second rail 13. The first rail 12 and the second rail 13 are formed along opposite longitudinal sides of the bracket 10. The first rail 12 defines a first slot 122. The second rail 13 defines a second slot 133. The second rail 13 is shorter than the first rail 12. The jags 14 are arranged like a washboard and adjacent to an end of the second rail 13. The hooks 16 are formed at corners of the bracket 10, for fastening the bracket 10 to a place, such as a computer enclosure, a mother board or a heat sink.

Figure 2:
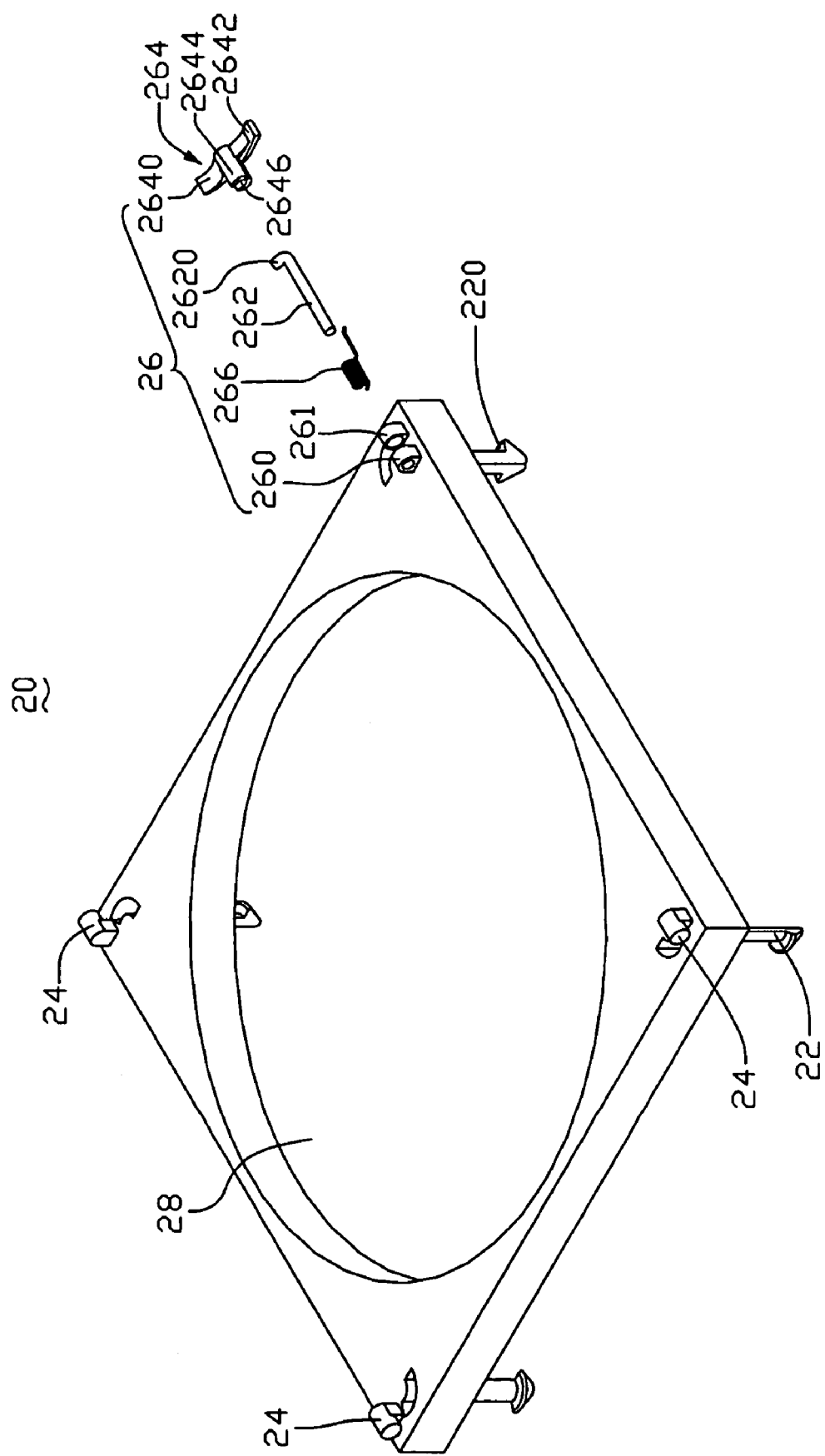
FIG. 2 is an enlarged exploded view of a saddle of the apparatus of FIG. 1, but inverted.
Figure 3:
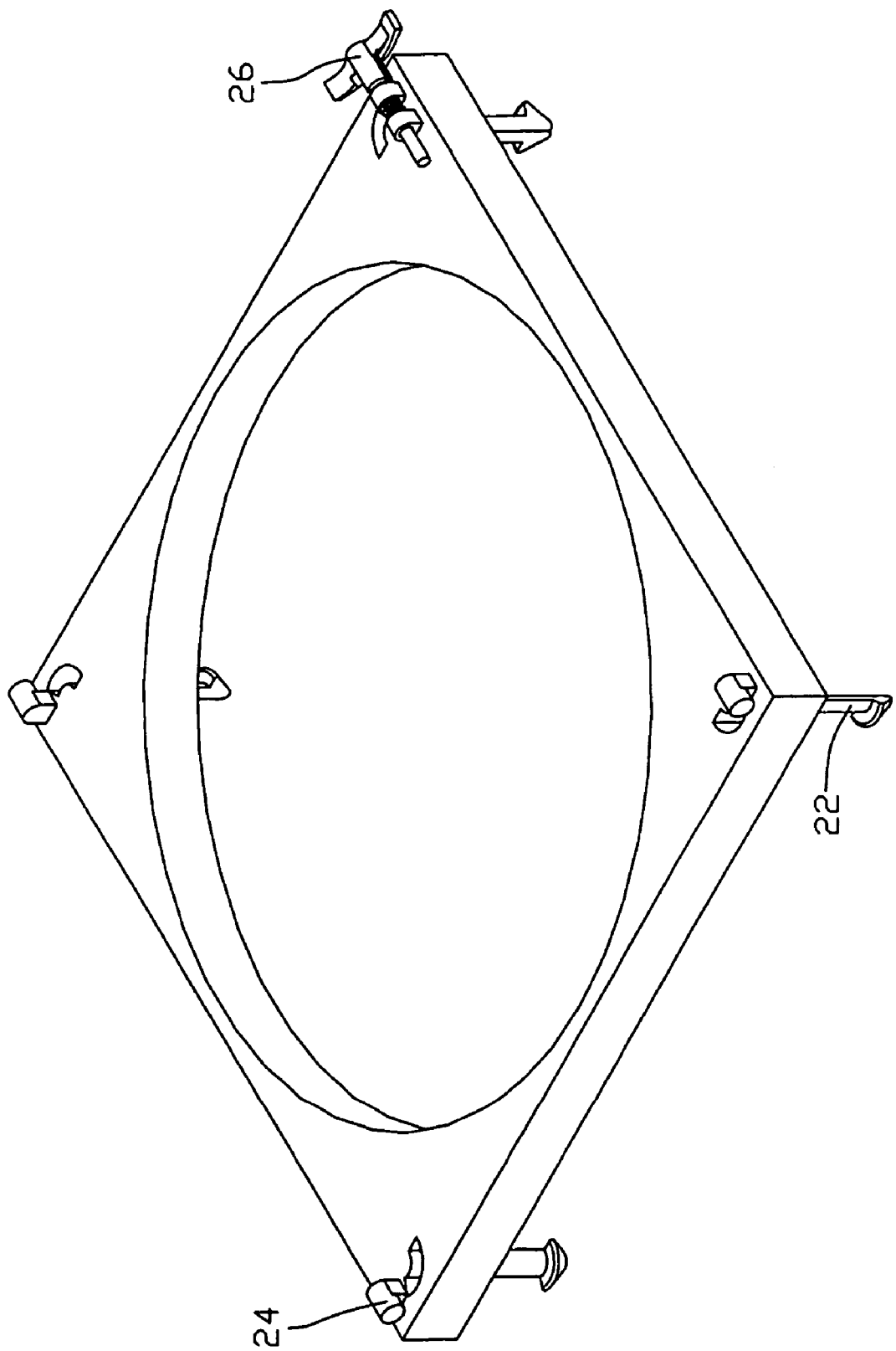
FIG. 3 is an assembled view of FIG. 2.
Figure 4:
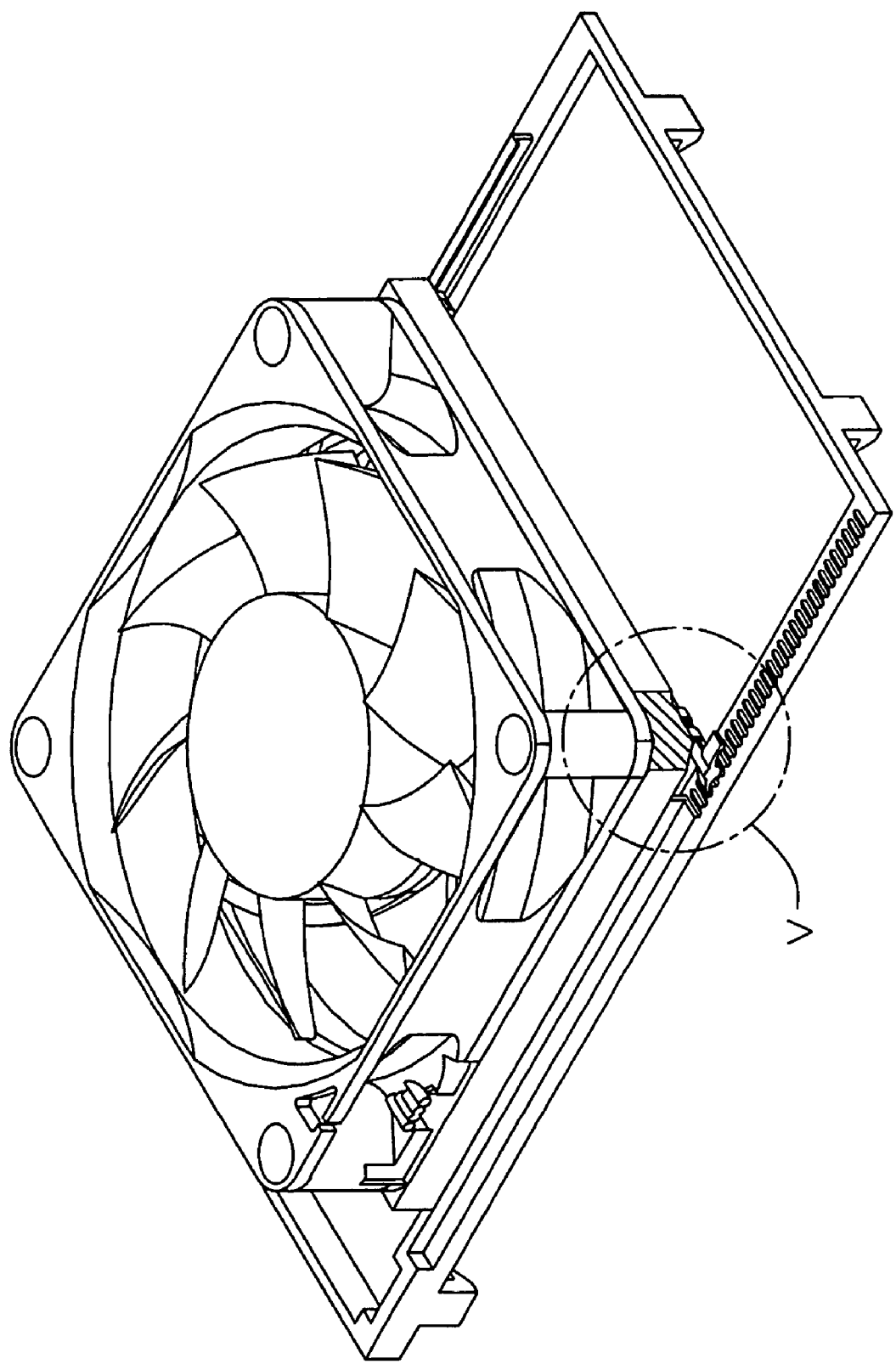
FIG. 4 is an assembled view of FIG. 1.

Referring to FIGS. 2-3, the saddle 20 comprises a first surface and a second surface. Three blocks 24 and a positioning member 26 are formed on the second surface of the saddle 20. Two pairs of posts 22 having hooks thereon are formed on the first surface of the saddle 20. The saddle 20 defines a central opening 28 therein. The blocks 24 and the positioning member 26 are positioned respectively at four corners of the bottom surface of the saddle 20. The positioning member 26 comprises two hollow supports 260, 261, a shaft 262 extendable through the supports 260, 261, a handle 264 and a torsion spring 266 enlaced on a middle portion of the shaft 262. The torsion spring 266 extends through the supports 260, 261 and resists the support 261, the handle 264. The handle 264 comprises a first lug 2640, a second lug 2642 opposing to the first lug 2640. The blocks 24 and the supports 260 are in the same height to keep balance. The shaft 262 has a curve-part 2620 at one end thereof. A bulge 2644 with a nick 2646 is formed between the first lug 2640 and the second lug 2642.

Figure 5:
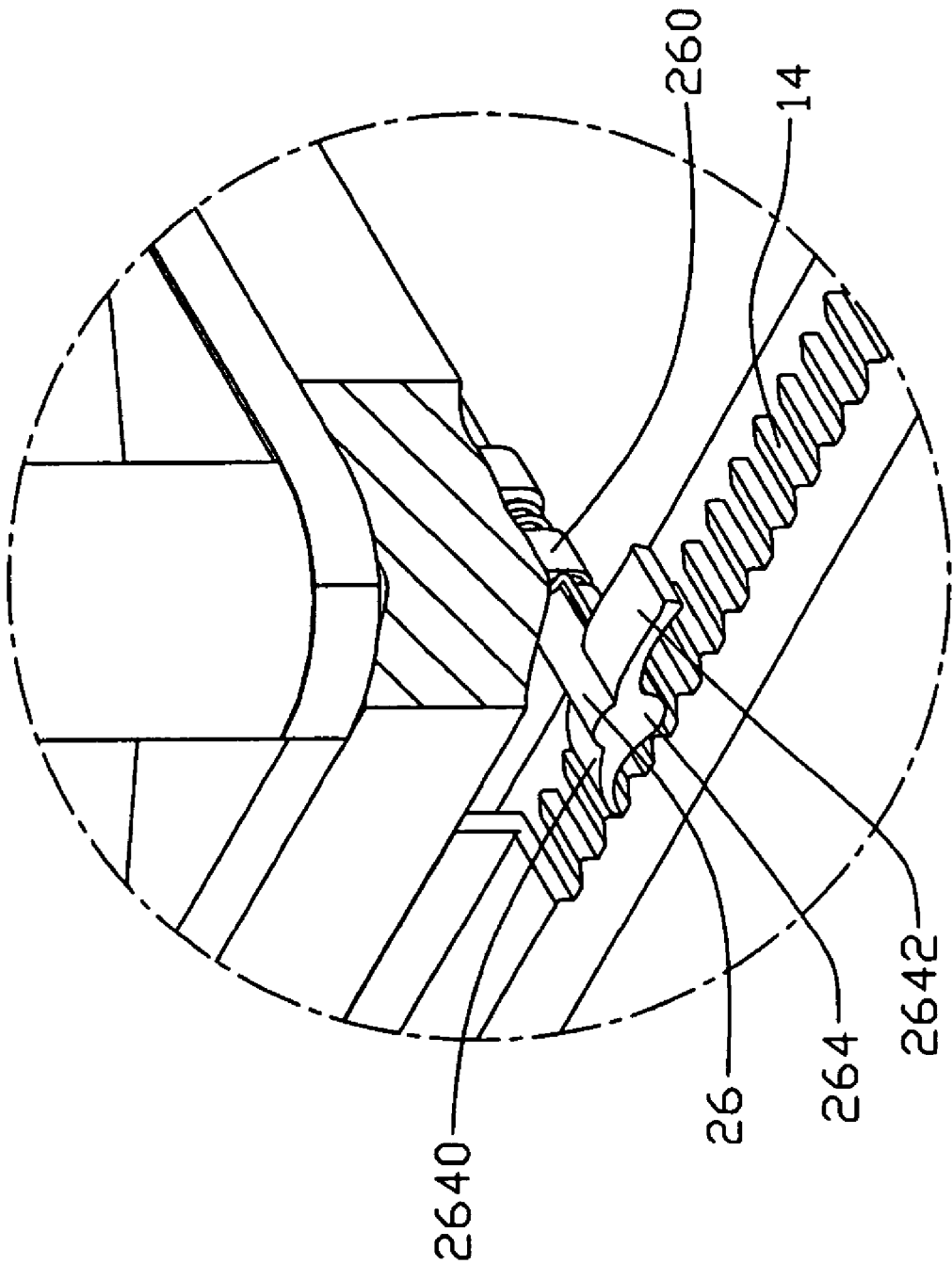
FIG. 5 is an enlarged view of an indicated portion V of FIG. 4.

In assembly, referring to FIGS. 1-5, the posts 22 of the saddle 20 respectively extend through four holes 32 defined at corners of the fan 30. The hooks 220 of the posts 22 clip around of the holes 32. The saddle 20 carrying the fan 30 is then laid on the bracket 10. The blocks 24 are received into and slide in the first slot 122 of the first rail 12 and the second slot 133 of the second rail 13. The saddle 20 is moved on the bracket 10 until the fan 30 carried on the saddle 20 is located in a proper position. Referring to FIG. 5, the mounting component 26 is held on the bracket 10. The first lug 2640 is clipped in one jag 14 and the second lug 2642 is above the jags 14. When the position of the saddle 20 corresponding to a cooled component on the motherboard is changed, a force exerted on the second lug 2642 and the second lug 2642 is thus lightly moved down. The first lug 2640 moves upward and is divorced from the jag 14. The blocks 24 may slide in the first and second slot 122, 133 again. The second lug 2642 is forced until the saddle 20 carrying the fan 30 moved to a position where the fan 30 directs to the component (not shown) needed to be cooled. The second lug 2642 is released, and the first lug 2640 is blocked in another jag 14 under the control of the torsion spring 266. The saddle 20 is mounted on the bracket 10 firmly, having the fan 30 directing to the component.

In other embodiments the blocks 24 may be other shapes, such as a hollow hemispheroid, sphere or cube, so long as the blocks 24 can slide in the first, and second slots 122, 133. It is feasible that more than one saddle 20 may be positioned on the bracket 10 for carrying more fans 30 to satisfy heat dissipation requirement in different places of a computer system. Moreover, more than one positioning member 26 may be mounted on adjacent corners of the saddle 20 to engage with the bracket 10. It is feasible that a spring slip is instead of the torsion spring 266.

It is understood that the invention may be embodied in other forms without departing from the spirit thereof. Thus, the present examples and embodiments are to be considered in all respects as illustrative and not restrictive, and the invention is not to be limited to the details given herein.

We claim:

1. An apparatus for supporting a cooling device thereon, the apparatus comprising:
    a bracket defining two opposing rails and a washboard-like member extending along a direction in which the rails extend; and
    a saddle carrying the cooling device thereon, the saddle comprising a positioning member engaged in the washboard-like member to position the saddle to the bracket and two blocks slidable on the rails of the bracket under condition that the positioning member is disengaged from the washboard-like member;
    wherein said positioning member comprises a spring enlaced thereon and a handle, and the handle is blocked in the washboard-like member under the control of the spring.

2. The apparatus as claimed in claim 1, wherein said handle comprises a first lug clipped in the washboard-like member and a second lug opposing to the first lug.

3. The apparatus as claimed in claim 1, wherein the handle is divorced from the washboard-like member by exerting a force on the handle.

4. The apparatus as claimed in claim 1, wherein said bracket further comprises hooks for mounting the bracket thereof.

5. An apparatus for supporting a cooling device thereon, the apparatus comprising:
    a bracket defining a plurality of jags; and
    a saddle carrying the cooling device thereon and having a torsional member secured thereon, the torsional member comprising a torsion spring, a shaft extending in the torsion spring, a handle at an end of the shaft, the handle being selectively engagable with the jags to secure the saddle to the bracket and being disengagable with the jags by exerting a force thereon whereby the saddle can be slidable on the bracket from one position to another position, the torsion spring resisting the handle from being disengagable from the jags.

6. The apparatus as claimed in claim 5, wherein the bracket further comprises two rails formed along opposing sides of the bracket.

7. The apparatus as claimed in claim 6, wherein the jags are defined extending along a direction in which the rails extend.

8. The apparatus as claimed in claim 5, wherein said handle comprises a first lug clipped in the jags under the control of the torsion spring and a second lug opposing to the first lug.

9. The apparatus as claimed in claim 8, wherein the first lug is divorced from the jags by exerting a force on the second lug.

10. The apparatus as claimed in claim 5, wherein the saddle further comprises two blocks slidable on the rails of the bracket.

* * * * *

UNITED STATES PATENT AND TRADEMARK OFFICE
CERTIFICATE OF CORRECTION

| | | |
|---|---|---|
| PATENT NO. | : 7,631,850 B2 | Page 1 of 1 |
| APPLICATION NO. | : 11/135745 | |
| DATED | : December 15, 2009 | |
| INVENTOR(S) | : Lee et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1063 days.

Signed and Sealed this

Second Day of November, 2010

David J. Kappos
*Director of the United States Patent and Trademark Office*